United States Patent
Johnson et al.

(10) Patent No.: US 8,360,373 B2
(45) Date of Patent: Jan. 29, 2013

(54) DISPLAY APPARATUS AND METHOD

(75) Inventors: Blake M. Johnson, St. Paul, MN (US);
Joseph H. Bowser, Minneapolis, MN (US)

(73) Assignee: Target Brands, Inc., Minneapolis, MN (US)

( * ) Notice: Subject to any disclaimer, the term of this patent is extended or adjusted under 35 U.S.C. 154(b) by 419 days.

(21) Appl. No.: 12/561,458

(22) Filed: Sep. 17, 2009

(65) Prior Publication Data

US 2011/0062294 A1    Mar. 17, 2011

(51) Int. Cl.
*F16M 13/00* (2006.01)
*F16M 11/02* (2006.01)
*F16M 11/04* (2006.01)
*A47B 91/00* (2006.01)
*A47G 29/00* (2006.01)
*B65D 19/00* (2006.01)
*A47F 7/00* (2006.01)

(52) U.S. Cl. ........ 248/161; 248/551; 248/552; 248/553; 248/177.1; 248/187.1; 248/346.01; 248/346.03; 248/349.1; 211/26; 211/26.2; 211/60.1; 211/4; 340/568.3; 340/568.4; 340/568.8; 340/568.1

(58) Field of Classification Search .......... 248/161, 248/551–553, 177.1, 187.1, 346.01, 346.03, 248/349.1; 211/26, 26.2, 60.1, 4; 360/568.3–568.4, 360/568.8; 340/568.2
See application file for complete search history.

(56) References Cited

U.S. PATENT DOCUMENTS

| | | | |
|---|---|---|---|
| 4,898,493 A * | 2/1990 | Blankenburg | 403/326 |
| D323,085 S | 1/1992 | Konkel | |
| 5,146,205 A | 9/1992 | Keifer et al. | |
| 5,176,465 A * | 1/1993 | Holsted | 403/379.6 |
| 6,386,906 B1 | 5/2002 | Burke | |
| 6,471,176 B2 * | 10/2002 | Berthiaume | 248/523 |
| 6,476,717 B1 | 11/2002 | Gross et al. | |
| 6,690,277 B1 | 2/2004 | Hansen et al. | |
| 6,700,488 B1 * | 3/2004 | Leyden et al. | 340/568.1 |
| 6,756,900 B2 | 6/2004 | Leyden et al. | |
| 6,799,994 B2 | 10/2004 | Burke | |
| 6,896,134 B2 * | 5/2005 | Russell et al. | 206/320 |
| 6,946,961 B2 | 9/2005 | Fredericksen et al. | |
| 7,015,596 B2 | 3/2006 | Pail | |
| 7,187,283 B2 * | 3/2007 | Leyden et al. | 340/568.1 |
| D540,566 S | 4/2007 | Scholen et al. | |
| 7,202,786 B2 | 4/2007 | Marszalek et al. | |
| 7,209,038 B1 * | 4/2007 | Deconinck et al. | 340/568.8 |
| 7,242,280 B2 | 7/2007 | Fredericksen | |
| 7,287,652 B2 * | 10/2007 | Scholen et al. | 211/26 |
| 7,327,276 B1 | 2/2008 | Deconinck et al. | |
| D568,064 S | 5/2008 | Scholen et al. | |
| 7,654,399 B2 | 2/2010 | Scholen et al. | |
| 7,658,363 B2 * | 2/2010 | Meyer | 248/551 |
| 7,744,404 B1 * | 6/2010 | Henson et al. | 439/501 |
| 2008/0169923 A1 | 7/2008 | Belden et al. | |
| 2009/0002977 A1 * | 1/2009 | Arnold, III | 362/183 |
| 2010/0060532 A1 * | 3/2010 | Kuang et al. | 343/713 |
| 2010/0133209 A1 | 6/2010 | Scholen et al. | |
| 2011/0042331 A1 | 2/2011 | Johnson et al. | |
| 2011/0204111 A1 * | 8/2011 | Lee | 224/567 |

* cited by examiner

Primary Examiner — Terrell McKinnon
Assistant Examiner — Christopher Garft
(74) Attorney, Agent, or Firm — Griffiths & Seaton PLLC

(57) ABSTRACT

Some embodiments of a product display apparatus may provide consumers with access to samples of portable electronic devices while maintaining the security of the sample devices. The display apparatus can present the sample devices in a manner that encourages consumers to view and operate the user interface of the samples even though each sample unit cannot be physically moved from the display apparatus.

20 Claims, 6 Drawing Sheets

DISPLAY APPARATUS AND METHOD

TECHNICAL FIELD

This disclosure relates to a display apparatus for displaying products, for example, in a retail store environment.

BACKGROUND

Display fixtures can be used in retail stores or other environments to present various products to consumers. For example, electronic devices can be displayed in stores to draw the interest of potential consumers. The display fixtures may provide the consumers with the opportunity to handle or use a number of sample devices before purchasing an electronic device in a sealed package.

For example, display fixtures can secure sample video game consoles in an enclosure so that consumers can play one or more video games or otherwise test the video game consoles. Such display fixtures often include a video display device and one or more game controllers that are connected to the video game console on display. The sample video game console may be enclosed so that the consumer can access only the handheld controllers, but a store worker can provide a video game console of the same type in a sealed package for purchase by the consumer.

Some display fixtures are specifically designed to provide consumer access to a number of digital cameras. Sample cameras can be lifted from a display fixture so that consumers can handle and explore features. A security tether cable may be connected between each of the sample cameras and the display fixture so as to deter theft. If a sample camera is moved beyond a predetermined distance from the display fixture, the security tether cable can activate an audible alarm to alert store workers. The audible alarm may continue until a store worker arrives at the display fixture to deactivate the alarm.

Other display fixtures are configured to retain cellular phones, personal digital assistants (PDAs), or other portable communication devices. The sample communication devices that are displayed at such a fixture may be arranged so that consumers can handle the device and inspect the user interface. In some circumstances, security tether cables are connected to the sample communication devices so as to deter theft. Here again, if a sample communication device is moved beyond a predetermined distance from the display fixture, the security tether cable can activate an audible alarm to alert store workers. The audible alarm may continue until a store worker arrives at the display fixture to deactivate the alarm.

SUMMARY

Some embodiments of a product display apparatus may provide consumers with access to operational global positioning system (GPS) units or other portable electronic devices while maintaining the security of the sample devices. In particular embodiments, the display apparatus presents the sample GPS units (or other portable electronic devices) in a manner that encourages consumers to view and operate the user interface of the samples even though each sample unit cannot be lifted or moved away from a base portion of the display apparatus. In such circumstances, the display fixture need not employ security tether cables that activate an audible alarm because the GPS units may be fixedly locked to the base of the display apparatus. Moreover, the display apparatus may provide convenient access for a store worker to add or replace sample units on the display fixture while maintaining the security of the sample units even when they are separated from the display apparatus.

These and other embodiments described herein may provide one or more of the following benefits. First, some embodiments of the display apparatus can present one or more portable consumer electronic devices in a manner that promotes consumer access and interaction with the user interface of each device without requiring the presence of a store worker. Second, some embodiments of the display apparatus can reduce the likelihood of theft of displayed portable electronic devices without the need to employ security tethers that activate an alarm. For example, the display fixture can rigidly lock the devices at a selected distance relative to the base of the display apparatus while maintaining consumer access to the user interface of the devices. Third, some embodiments of the display apparatus can deter theft of the displayed devices by including security brackets and mounting posts that are lockingly coupled to the portable electronic devices, even when the portable electronic devices are separated from the base of the display apparatus. Fourth, the display apparatus can eliminate or otherwise reduce the time spent by store workers attending to security tether cables and the associated alarms. Fifth, store workers may spend less time replacing portable electronic devices coupled to the display apparatus because each new sample device can be assembled thereto in a prompt, toolless manner.

DETAILED DESCRIPTION OF ILLUSTRATIVE EMBODIMENTS

Figure 1:
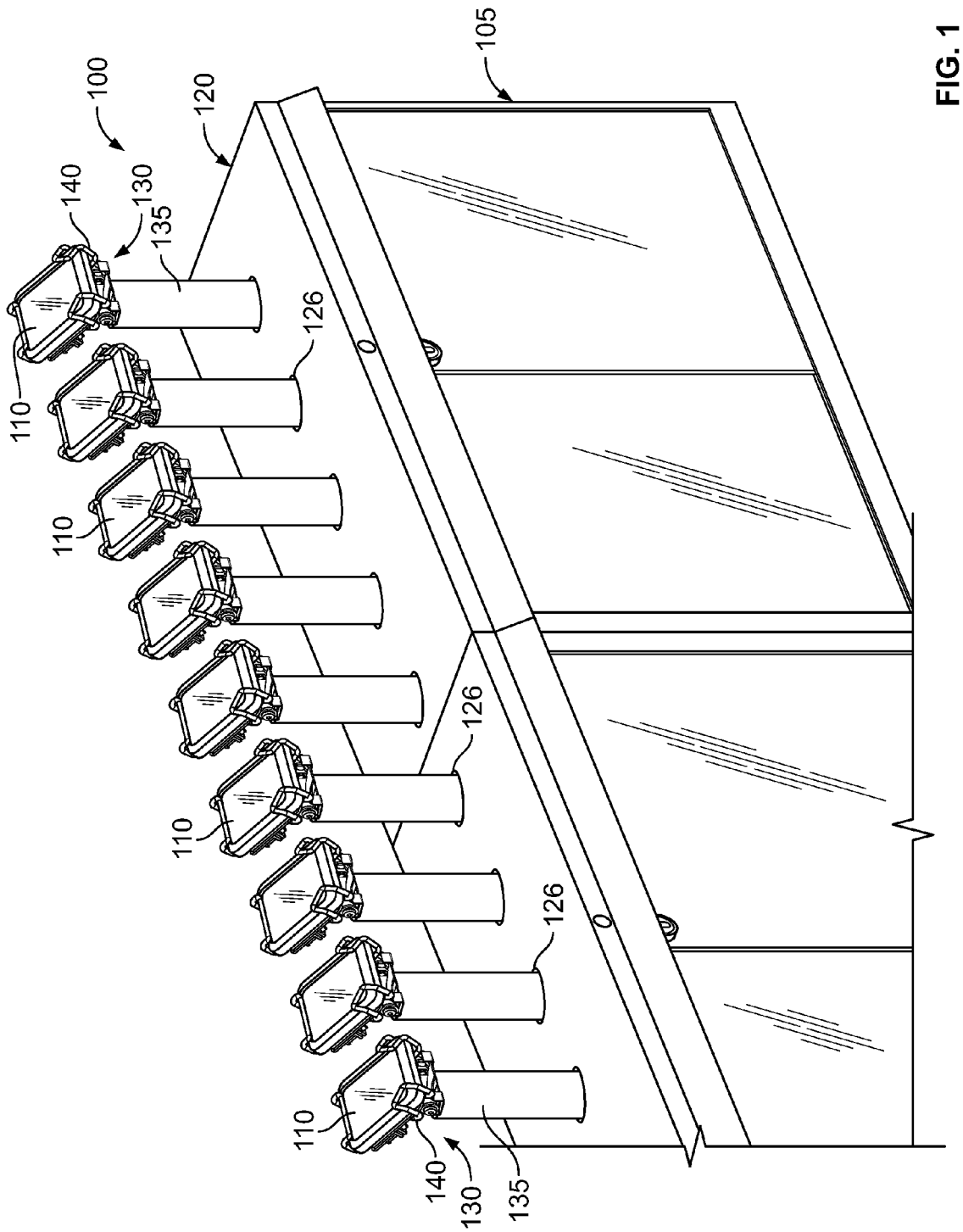
FIG. 1 is a perspective view of a display apparatus for displaying portable GPS units or other electronic devices in a retail environment, in accordance with some embodiments.

Referring to FIG. 1, some embodiments of a display apparatus 100 present portable consumer electronic devices, such as portable GPS units 110, to consumers in a retail store environment. In this embodiment, the display apparatus 100 includes a mounting assembly 130 having a security bracket 140 that grasps a corresponding portable GPS unit 110 to fixedly secure the portable GPS unit 110 to a base 120. As such, a plurality of the portable GPS units 110 are presented to consumers in a manner that promotes consumer access and interaction with the user interface of each unit 110. In some circumstances, a consumer may swivel the security bracket and the GPS unit 110 retained therein relative to the base 120, but the GPS unit 110 cannot be lifted or otherwise moved away from the base 120. As such, the display apparatus need not employ security tether cables that activate an audible alarm because the sample GPS units 110 are rigidly locked at a selected distance relative to the base 120 of the display apparatus 100.

Briefly, in use, the base 120 can be unlocked and hingedly raised to reveal an internal space 121 (FIGS. 2-3) accessible by a user, such as a store worker. As such, the store worker may access an internal space 121 of the display apparatus 100 so as to unlock the mounting assembly 130 from the base 120 and thereby remove a selected GPS unit 110 (and its associated mounting assembly) from the display apparatus 100. Because the mounting assembly 130 (including the security bracket 140) securely couples with the portable GPS unit 110 even when the unit 110 is separated from the display apparatus 100, the portable GPS unit 110 is less susceptible to theft by nearby persons or a store worker. Moreover, each portable GPS unit 110 intended for presentation on the display apparatus 100 can be delivered to the store (e.g., from a remote vendor, distribution hub, or the like) in a pre-assembled state with the mounting assembly 130 securely coupled thereto. Thereafter, a store worker can readily connect a power cord, such as an automotive accessory plug (e.g., a car adapter plug or the like) that is provided with most GPS units, to a corresponding port in the base 120 and install the mounting assembly 130 (including the GPS unit 110 securely coupled thereto) to the base 120 of the display apparatus 100. When the base 120 is closed and locked, the consumers can view and handle any of the sample GPS units, but have no access to the power supply or the locking mechanism of the mounting assembly 130 arranged in the internal space 121.

Accordingly, in some implementations, consumers in a retail environment can examine and handle one or more of the portable GPS units 110 that are secured to the display apparatus 100, without requiring a store worker to unlock a secured container and remove the GPS units from inside the container. In such embodiments, the display apparatus 100 lockingly secures each of the portable GPS units 110 at a fixed distance from the base 120, thus reducing the time spent by store workers trying to prevent theft of the sample units 110 and deactivating security tether alarms (after consumers incidentally pull security tether cables). Furthermore, in particular embodiments the display apparatus 100 is configured to allow for prompt and toolless removal of old portable GPS units 110 and installation of new models of portable GPS units 110 (e.g., when new models become available).

It should be understood from the description herein that the display apparatus 100 can be configured to retain portable electronic devices other than the GPS units 110 described in connection with FIG. 1. For example, in alternative embodiments, the display apparatus 100 may be configured to display digital cameras, cellular phones, PDAs, or other portable electronic devices.

When the mounting assembly 130 is secured in the display apparatus 100 (as shown in FIG. 1), the elongate configuration of the mounting assembly 130 may arrange the corresponding GPS unit 110 substantially at hand-level for the consumers passing through the store aisle. The mounting bracket 140 may have a reduced size so as to provide the consumer with access to most or all of the user interface functions of the GPS unit 110. As such, each consumer can examine and try out one or more of the GPS units 110 without requiring the presence of a store worker. Furthermore, the secure configuration provided by the display apparatus 100 can reduce the likelihood of theft of the displayed GPS units 110. Moreover, the store workers are not necessarily required to attend to security tether cables and their associated alarm system, thereby allowing the store workers to spend more of their time on other work tasks (e.g., servicing consumers).

In some embodiments, information about the GPS units 110 can be displayed on a visible surface of the base 120 or on a rear wall behind the individual GPS units 110, thus communicating information about each of the individual GPS units 110 (e.g., price, warrantees, special features, and the like). Additionally, the base 120 of the display apparatus 100 can be mounted to the top side of a secured cabinet (e.g., the display cabinet 105) containing the packaged GPS units 110 available for purchase and transport by the consumers. Such a configuration may permit store workers to promptly locate a boxed GPS unit 110 (e.g., that the customer can purchase) of the same model identified and selected by a consumer from the array of GPS units 110 displayed over the base 120.

In the embodiment depicted in FIG. 1, the mounting assemblies 130 are uniformly spaced along a line in the base 120 and the mounting assemblies 130 are of similar heights and secure the GPS units 110 of similar sizes. In alternative embodiments, the base 120 can include mounting sleeves in different configurations (e.g., staggered) and the mounting assemblies 130 can be of differing heights.

Figure 2:
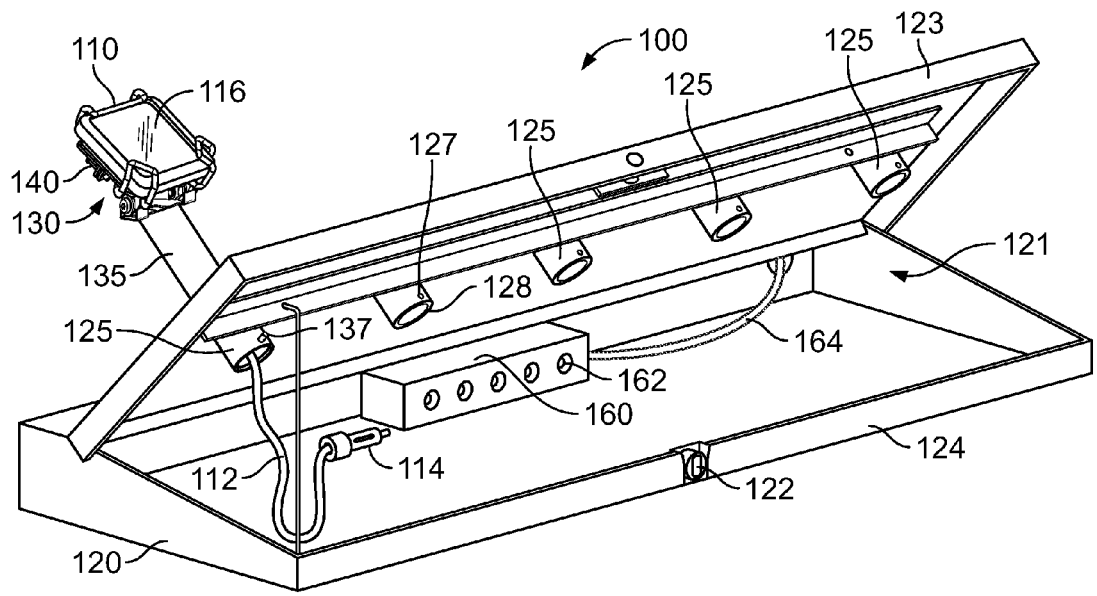
FIG. 2 is a perspective view of the display apparatus of FIG. 1 in an opened position.
Figure 3:
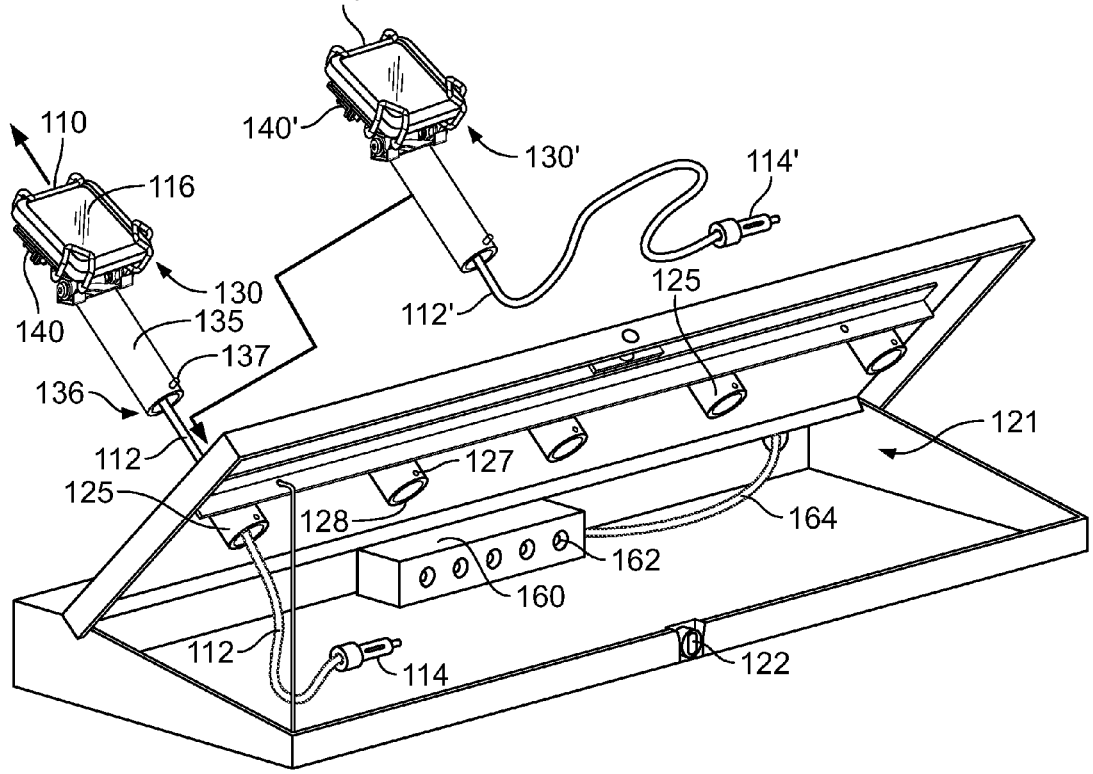
FIG. 3 is a perspective view of the display apparatus of FIG. 1, with one of the portable GPS units removed from the display apparatus, in accordance with some embodiments.

Referring now to FIGS. 2-3, in some embodiments, the base 120 of the display apparatus includes a plurality of mounting sleeves 125 that extend at least partially into the internal space 121 defined, at least in part, by the base 120. Each mounting sleeve 125 can accept and secure a corresponding mounting assembly 130. As will be described in greater detail below, each mounting assembly 130 optionally includes a security bracket 140 coupled to a substantially hollow mounting post 135, which can slidably mate with the mounting sleeve 125. In such circumstances, a store can readily remove or install one or more mounting assemblies 130 (including the GPS units 110 secured thereto) relative to the base 120 of the display apparatus 100. The mounting post 135 and sleeve 125 can securely mate in a manner so that removal and installation can be accomplished without the use of handheld tools or special wiring (e.g., custom power cords, custom power adapters, or the like), thereby reducing the time spent by store workers on updating or maintaining the display apparatus 100.

In some embodiments, the base 120 includes a locking mechanism 122 for securing the base 120 in the closed configuration shown in FIG. 1. The base 120 can be locked in the closed configuration to present the GPS units 110 to consumers in a retail environment while limiting access to the features that secure the mounting assembly 130 to the base 120. While the base 120 is in the closed configuration, the GPS units 110 are presented in such a way as to encourage consumers to access and interact with the user interface 116 of each GPS unit 110 while being generally unable to lift or otherwise separate the individual GPS units 110 from the base 120. As such, consumers may interact with and explore features of the GPS units 110 without requiring a store worker to remove individual GPS units 110 from a display. Furthermore, since the GPS units 110 are secured to the base 120, the display apparatus 100 need not employ security tether cables to activate an audible alarm when individual GPS units 110 are moved beyond a predetermined distance from the base 120.

The base 120 may be maintained in the closed configuration shown in FIG. 1 until such a time as one or more GPS units 110 are added or removed from the base 120. For example, manufacturers may regularly release new models of GPS units that include new features, at which time the older models of GPS units can be removed from the display apparatus 100 and replaced with the newer models. When replacing GPS units 110 in the display apparatus 100, it is advantageous for store workers to promptly and toollessly replace the individual GPS units 110. At the same time, it is also advantageous to make the GPS units less susceptible to theft by store workers or other nearby persons. In some embodiments, new GPS units can be shipped from a remote vendor, distribution hub, or the like, in a pre-assembled state secured to the mounting assembly 130. In such embodiments, a retail store can receive a new GPS unit secured to a security bracket 140 and mounting assembly 130 at which time a store worker can replace a GPS unit 110 currently secured to the display apparatus 100 with the new GPS unit and mounting assembly 130.

Accordingly, a store worker can transition the base 120 from the closed configuration shown in FIG. 1 to the open configuration shown in FIG. 2 by unlocking the mechanism 122 and pivoting the top portion 123 of the base 120, which can at least partially separate the top portion 123 from the bottom portion 124 and expose the interior space 121. The top portion 123 may be sloped generally downward toward the front of the base 120 when in the closed configuration so that additional clearance space is provided when the base 120 is in the open configuration (e.g., when the top portion 123 is pivoted upward from the bottom portion 124). As will be described in greater detail below, once the base 120 is in the open configuration shown in FIGS. 2-3, a store worker can remove one or more of the individual GPS units 110 and replace them with new GPS units 110.

In some embodiments, the display apparatus 100 can be configured to include features that allow the individual GPS units 110 to be displayed to retail consumers in a fully functional state without the use of special power adapters, customized power cables or power sources, or the like. For example, individual GPS units 110 can be supplied from the manufacturer with corresponding power cords 112 that can connect to standard automotive accessory power ports (e.g., ports to receive car adapter plugs, cigarette lighter ports, or the like). In such circumstances, the display apparatus 100 can be equipped with a power distribution block 160 that includes one or more power ports 162, on an exterior surface, that can accept standard automotive power plugs, such as a power plug 114 included on one end of the power cord 112 supplied by the manufacturer of the GPS unit 110. The power distribution block 160 in this embodiment includes a source power cord 164 with a standard AC power plug (not shown) configured to be connected to a standard AC outlet at the rear or side of the display apparatus 100. The source power cord 164 can be attached to the power distribution block 160 and configured to exit the base 120 (e.g., through a rear aperture). The power distribution block 160 can contain circuitry that converts standard AC power (e.g., 110-120 volt 60 Hz, 220-240 volt 50 Hz, or the like) to about the same voltage as available from a power port found in an automobile (e.g., about 12 volt DC in some embodiments). As such, the GPS units 110 can be powered using the standard automotive power cords 112 supplied by the manufacturer of the GPS units 110. This configuration can advantageously reduce the costs incurred by the retail store in displaying the GPS units 110. Because such power cords 112 are commonly supplied in retail packages with the individual GPS units 110, the retail store is not necessarily required to install custom power cables and power sources for the display units.

Still referring to FIGS. 2-3, some embodiments of the display apparatus 100 include the security bracket 140 that grasps a corresponding portable GPS unit 110 to fixedly secure the portable GPS unit 110 to the mounting post 135. As will be described in greater detail below, while the security bracket 140 can secure a corresponding GPS unit 110 to the mounting post 135, the security bracket 140 can be configured to allow a user to pivot the individual GPS units 110 with respect to a horizontal axis 141 (FIG. 5) such that the angle between a plane defined by the user interface 116 of the GPS unit 110 and the longitudinal axis of the mounting post 135 can be changed by a consumer. For example, a retail consumer can adjust the GPS unit 110 such that the user interface 116 can be more comfortably and conveniently viewed by the consumer and such that functions of the user interface 116 can be more comfortably accessed by the consumer. This adjustment of the angle of the GPS unit 110 can be accomplished by a consumer without the use of tools and while the GPS unit 110 remains lockingly secured to the base 120. In such an arrangement, the GPS unit 110 can be pivoted with respect to the horizontal axis 141 (FIG. 5) while the mounting assembly (including the security bracket 140 and the mounting post 135) can rigidly maintain the pivot axis 141 (FIG. 5) at a fixed distance from the base 120.

Referring now to FIG. 3, the display apparatus 100 can be configured to include features that reduce the time spent by store workers removing or installing one or more mounting assemblies 130 (including corresponding GPS units 110 secured thereto). Moreover, the display apparatus 100 in this embodiment includes features that deter theft of the GPS units 110 to be displayed by the apparatus 100. For example, an individual mounting assembly 130 can be delivered to a store (e.g., from a remote vendor, distribution hub, or the like) in a pre-assembled state with a GPS unit 110 securely coupled thereto, thereby deterring theft of the GPS unit 100 not only while being displayed by the apparatus 100, but also prior to and after display in the apparatus 100.

In some embodiments, a distribution hub can receive individual GPS units 110 to sell in a retail store, an example of which can be chosen to be displayed in a retail store environment. At the distribution hub, a mounting assembly 130 can be selected from available stock to be secured to the chosen GPS unit. In some embodiments, GPS units 110 of differing sizes may require individual mounting assemblies that include differently sized security brackets 140. In some embodiments, the security brackets 140 may be adjustable such that a single security bracket may secure more than one size of GPS unit. As will be described in greater detail below, the security bracket 140 may be configured such that once a GPS unit 110 is secured in the security bracket 140, one or more special security tools are required to remove the GPS unit 110 from the security bracket 140. Such security tools may be available only to those workers who are different from the local store workers that install the mounting assemblies 130 into the base 120 at a local retail store.

At the distribution hub, the power cord 112 (with automotive power plug 114) supplied by the manufacturer of the GPS unit 110 can also be passed through the hollow interior space of the mounting post 135 such that the distal end of the power cord 112 containing the automotive adapter 114 is closest to the distal end 136 of the mounting post 135. The proximal end of the power cord 112 (e.g., including a plug configured to be connected into the GPS unit 110) can be inserted into a corresponding power port on the GPS unit 110. The mounting assembly 130 (including the secured GPS unit 110 and attached power cord 112) can then be shipped from the distribution hub to a retail store environment. Accordingly, theft of the display unit 110 may be hindered because each GPS unit 100 is lockingly coupled to the mounting assembly 130 prior to delivery at a retail store environment. In such circumstances, local store workers and nearby consumers will not have access to the GPS unit 110 in a condition that is unlocked from the mounting assembly 130, whether the GPS unit 110 is coupled to or separated from the display base 120.

In some embodiments, when a new mounting assembly 130' coupled to a GPS unit 110'(e.g., a new model) and power cord 112' are received in a store, a local store worker may promptly install the GPS unit 110' to the display apparatus 100 by sliding the mounting assembly 130' into a selected sleeve 125 of the base 120 and inserting the power plug 114' in the power block 160. Such an installation process does not require the use of handheld tools or complex assembly tasks by the store worker. In this way, time spent by store worker is decreased. Furthermore, as described in more detail below, the mounting assemblies 130 can be configured such that store workers can install mounting assemblies 130 in the display base 120 without the use of tools or the need for additional power adapters, cords, or the like, further reducing the time spent by store workers coupling the GPS units 110 to the display apparatus 100.

Figure 4:
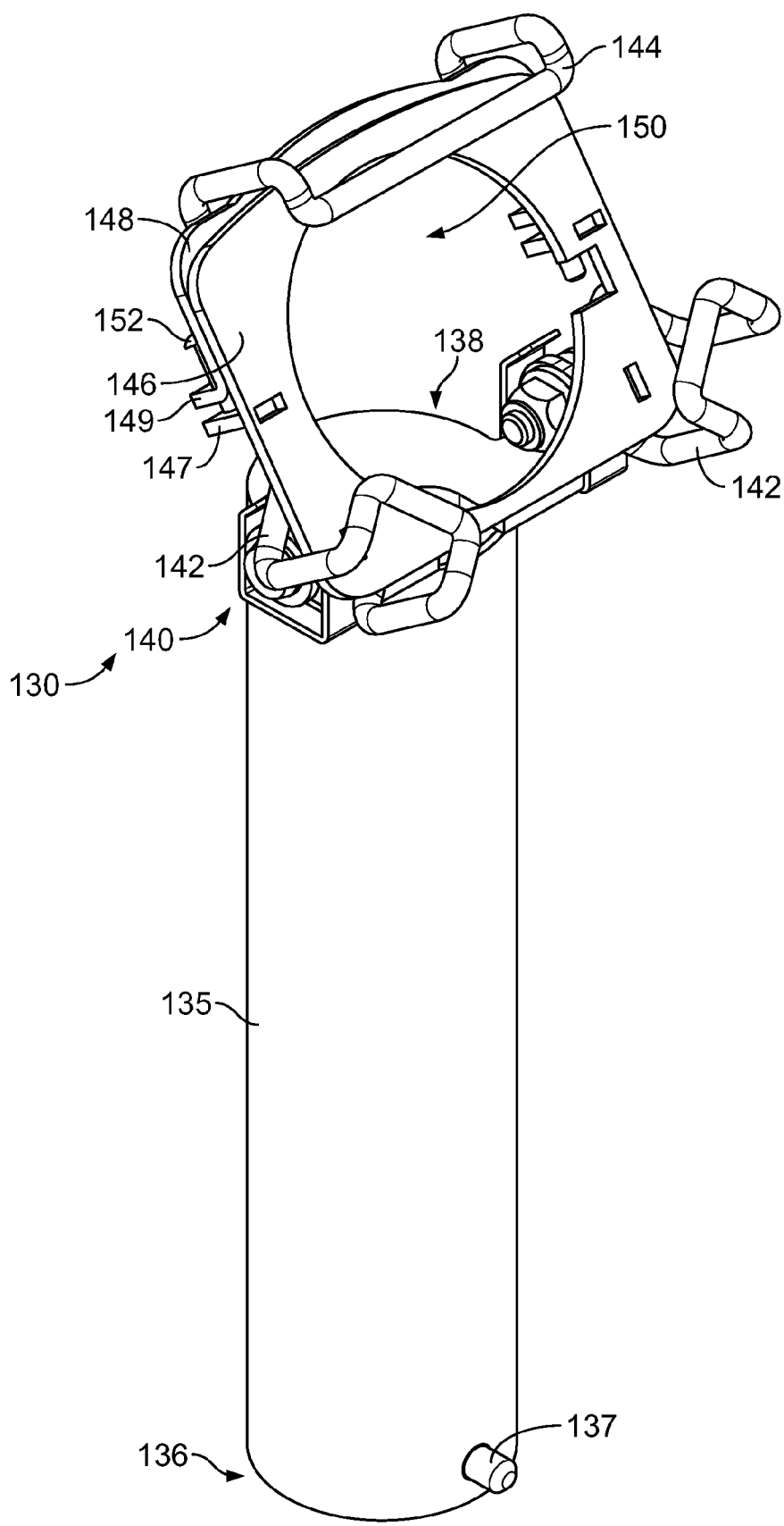
FIGS. 4-5 are perspective views of a mounting assembly to releasably lock with a portion of the display apparatus of FIG. 1 and to retain a portable GPS unit or other electronic device, in accordance with some embodiments.

Referring now to FIGS. 3-4, in some embodiments, the substantially hollow mounting post 135 includes a locking pin 137 near the distal end 136 that is resiliently biased to extend radially outward from the mounting post 135. For example, the locking pin 137 can be spring-biased to extend outward and can slide radially inward into an aperture in the post 135 in response to a pushing force. In such a configuration, an individual mounting assembly 130 can be secured to the base 120 by inserting the distal end 136 of the mounting post into one of the non-occupied mounting sleeves 125. As the distal end 136 is inserted in the mounting sleeve 125, an outer edge 126 (see FIG. 1) of the mounting sleeve can overcome the bias of the locking pin 137, thus causing the locking pin 137 to slide radially inward. When the locking pin 137 is slid radially inward a sufficient distance (e.g., when the outermost surface of the locking pin 137 is substantially flush with the outer surface of the mounting post 135, the mounting post 135 may be further inserted into the mounting sleeve 125 until the locking pin 137 resiliently pops radially outward into a securing orifice 127 included in the mounting sleeve 125. The location of the locking pin 137 and corresponding orifice 127 can ensure that when the locking pin 137 is positioned in the orifice 127, the GPS display unit 110 is in a desired orientation (e.g., facing toward the front of the base 120). Certain features of the mounting sleeve 125, such as a stop 128, can assist a store worker in aligning the locking pin 137 with the orifice 127. For example, a store worker may insert the mounting post 135 into the sleeve 125 until the distal end 136 of the mounting post 135 contacts the stop 128, thus ensuring that the locking pin 137 and the orifice 127 are longitudinally aligned. The store worker can then rotate the mounting assembly 130 while maintaining the distal end 136 of the mounting post against the stop 128 until the locking pin 137 and the orifice 127 are also radially aligned, such that the locking pin 137 resiliently pops into the orifice 127, thus securing the mounting assembly 130 and coupled GPS unit 110 in a desired orientation. Features, in addition to or in lieu of the stop 128, can be included in the display apparatus 100 to assist store workers in securing the mounting assembly to the base 120 and aligning the GPS unit 110 in a desired orientation.

In some embodiments, the mounting assembly 130 (and the GPS unit 110 and power cord 112 coupled thereto) can be removed from the base 120 of the display apparatus 100 without the use of handheld tools in a manner substantially the reverse of aforementioned installation. For example, when the display apparatus 100 is in the open configuration shown in FIG. 2 (e.g., by unlocking the mechanism 122 and lifting the top portion 123 of the base 120 to expose the internal space 121), the mounting assembly 130 can be promptly removed in a toolless manner. A store worker can unplug the power plug 114 from the power distribution block 160, push the locking pin 137 radially inward, and retract the mounting post 135 from the mounting sleeve 125. The entire mounting assembly 130 (and the GPS unit 110 and power cord 112 coupled thereto) then can be packaged at the store and shipped to, for example, a distribution hub for removal of the security bracket 140. This configuration can decrease the time spent by a store worker in removing the GPS unit 110 from the display apparatus 100.

Figure 5:
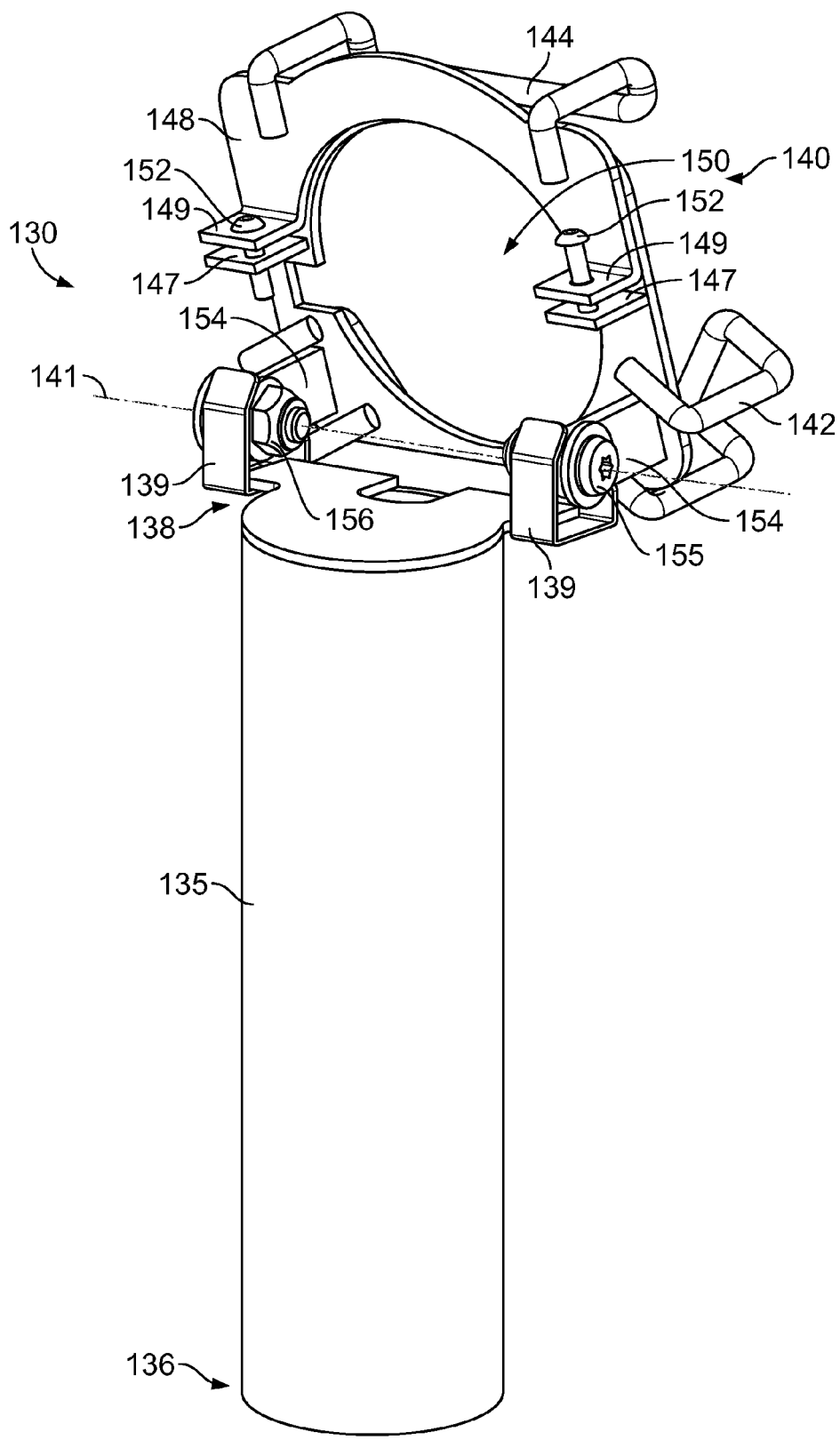

Referring now to FIGS. 4-5, the mounting assembly 130 in this embodiment includes the mounting post 135 that can be coupled to the display base 120 (shown in FIG. 1) and the security bracket 140 attached thereto that can be coupled to a portable electronics device, such as the GPS unit 110. In some embodiments, when the GPS unit 110 is coupled to the security bracket 140 and the mounting post 135 is coupled to the base 120 of a display apparatus 100 located in a retail store, the GPS unit 110 is securely attached to the display apparatus 100 and can be presented to consumers in a manner that promotes consumer access and interaction with the user interface 116 of the GPS unit 110. For example, in this embodiment, the mounting assembly 130 includes the mounting post 135 that can elevate the corresponding GPS unit 110 to be substantially at hand-level of a consumer passing through a store aisle. The security bracket 140 can be configured to pivot around the horizontal axis 141 (shown in FIG. 5) such that a consumer can pivot the GPS unit 110 until the user interface 116 of the GPS unit 110 is substantially aligned with the sight line of the consumer. This configuration further encourages the consumer to interact with the individual GPS units 110 coupled to the display apparatus 100.

In some embodiments, the security bracket 140 includes one or more lower corner brackets 142 and a top bracket 144 that can secure a GPS unit to backing plates 146 and 148 of the security bracket 140, while limiting the portions of the GPS unit 110 that are visually blocked by the security bracket 140. As such, the brackets 142 and 144 can be configured to be large enough to secure a GPS unit, but small enough to not adversely affect the visibility of a GPS unit 110 secured to the security bracket 140, while also providing access to the power port of the GPS unit 110. The backing plates 146 and 148 can define an opening 150 whereby a substantial portion of the back face of a GPS unit mounted thereto can be accessed. For example, the opening 150 can allow access to a power port in the GPS unit 110 so that the power cord 112 (see FIGS. 2-3) can be attached to the GPS unit 110.

In some embodiments, the backing plates 146 and 148 can be arranged in a substantially parallel manner such that they are in contact with each other and can be secured via connecting flanges 147 and 149 using fasteners 152. The backing plate 146 in this embodiment includes mounting flanges 154 that can be secured to a top plate 138 of the mounting post 135 using fasteners (e.g., bolts 155 and nuts 156) such that when secured, the security bracket 140 can pivot around the axis 141, but may not separate from the mounting post 135. The top plate 138 optionally includes flanges 139 that can be secured to flanges 154 and can limit the degree to which the security bracket 140 can pivot in relation to the mounting post 135. In some embodiments, the bolts 155 and nuts 156 can be configured to include security features that make disassembly more difficult without the use of specialty security tools. With such a configuration, it can be more difficult for the security bracket 140 to be separated from the mounting post 135, thus reducing the susceptibility of the GPS unit 110 to theft. For example, the bolts 155 may be configured such that specialty tools (e.g., torx bits, security torx bits, hex bits, proprietary tools, or the like) can be used to remove the security bracket 140 from the mounting post 135. In another example, in lieu of the bolts 155 and nuts 156, rivets can be used to permanently secure the bracket 140 to the post 135. As the difficulty of removing the bracket 140 from the post 135 increases, the susceptibility of the GPS unit 110 to theft can decrease.

Figure 6:
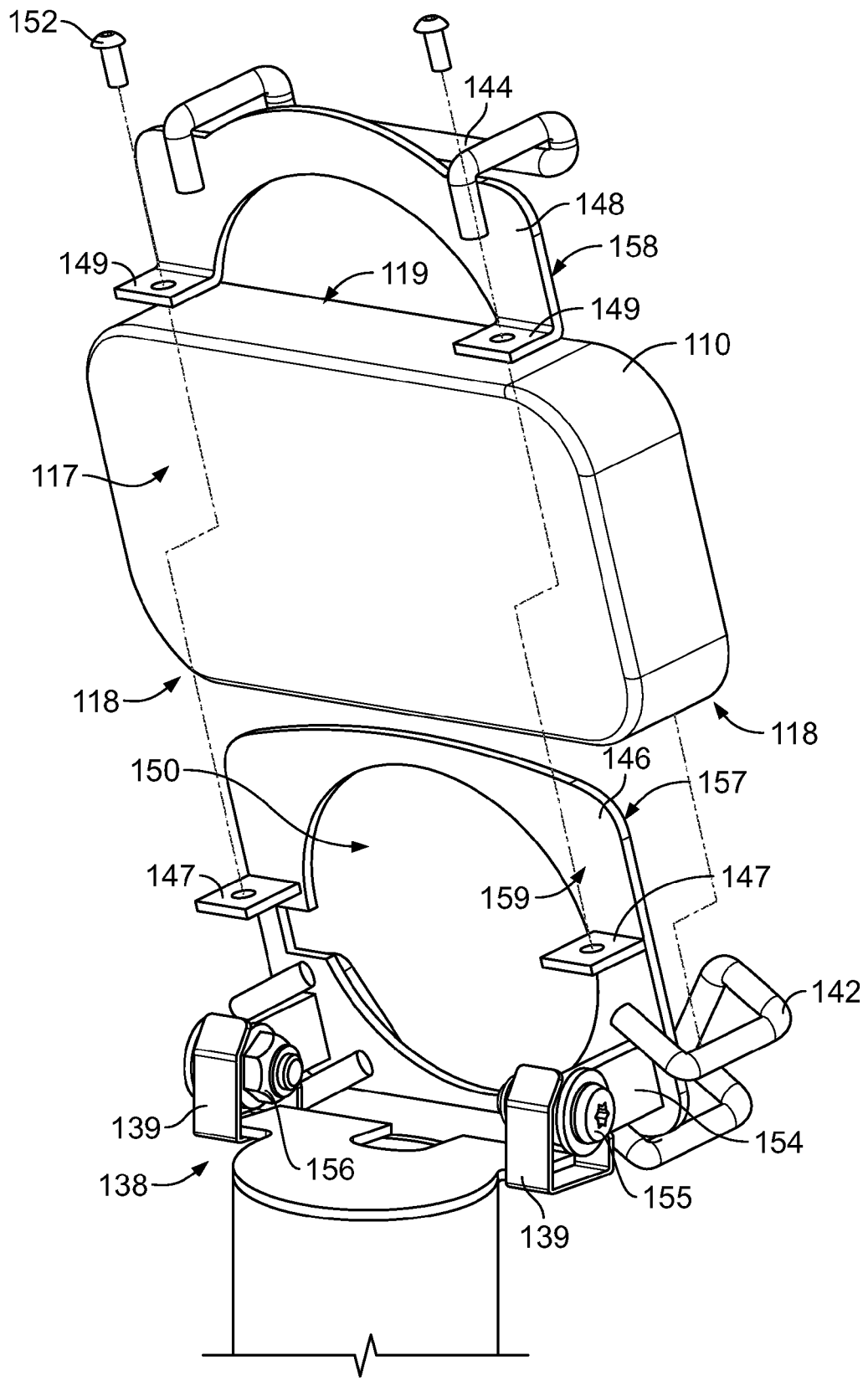
FIG. 6 is an exploded view of the mounting assembly of FIGS. 4-5 and a portable GPS unit to be retained in the mounting assembly, in accordance with some embodiments.

Referring now to FIG. 6, fasteners 152 can be removed, thus allowing the backing plate 148 (and attached top mounting bracket 144) to be separated from the remainder of the security bracket 140. In the separated configuration shown in FIG. 6, GPS units 110 can be removed from and installed into the security bracket 140. For example, the fasteners can be removed and the backing plate 148 can be separated as shown in FIG. 6 and the GPS unit (if installed) can be removed from the security bracket 140. Subsequently, a new GPS unit 110 can be installed (for example, at a distribution hub remote from the retail store environment) by placing the new GPS unit 110 against the backing plate 146 such that a back face 117 of the GPS unit is in contact with the front face 157 of the backing plate 146 and the corners 118 of the GPS unit 110 are surrounded by the corner brackets 142. The backing plate 148 can be assembled by placing the top bracket 144 such that the bracket 144 surrounds a top edge 119 of the GPS unit 110 and the front face 157 of the backing plate 148 is in contact with the rear face 159 of the backing plate 146. Once secured using the fasteners 152, the vertical movement of the GPS unit 110, relative to the security bracket 140, is limited by the corner brackets 142 and the top bracket 144 and the horizontal movement of the GPS unit 110, relative to the security bracket 140, is limited by the corner brackets 142.

In this configuration, the GPS unit 110 is secured to the security bracket 140, while reducing the portion of the GPS unit 110 that is concealed by the brackets 142 and 144 and the backing plates 146 and 148. As with the bolts 155, the fasteners 152 can be configured to include security features that increase the difficulty of disassembly without the use of specialty security tools. With such a configuration, it can be more difficult for the backing plates 146 and 148 to be separated from one another (allowing the GPS unit 110 to be removed from the security bracket 140), thus reducing the susceptibility of the GPS unit 110 to theft. For example, the fasteners may be configured such that specialty tools (e.g., torx bits, security torx bits, hex bits, proprietary tools, or the like) can be used to remove the fasteners 152.

Figure 7:
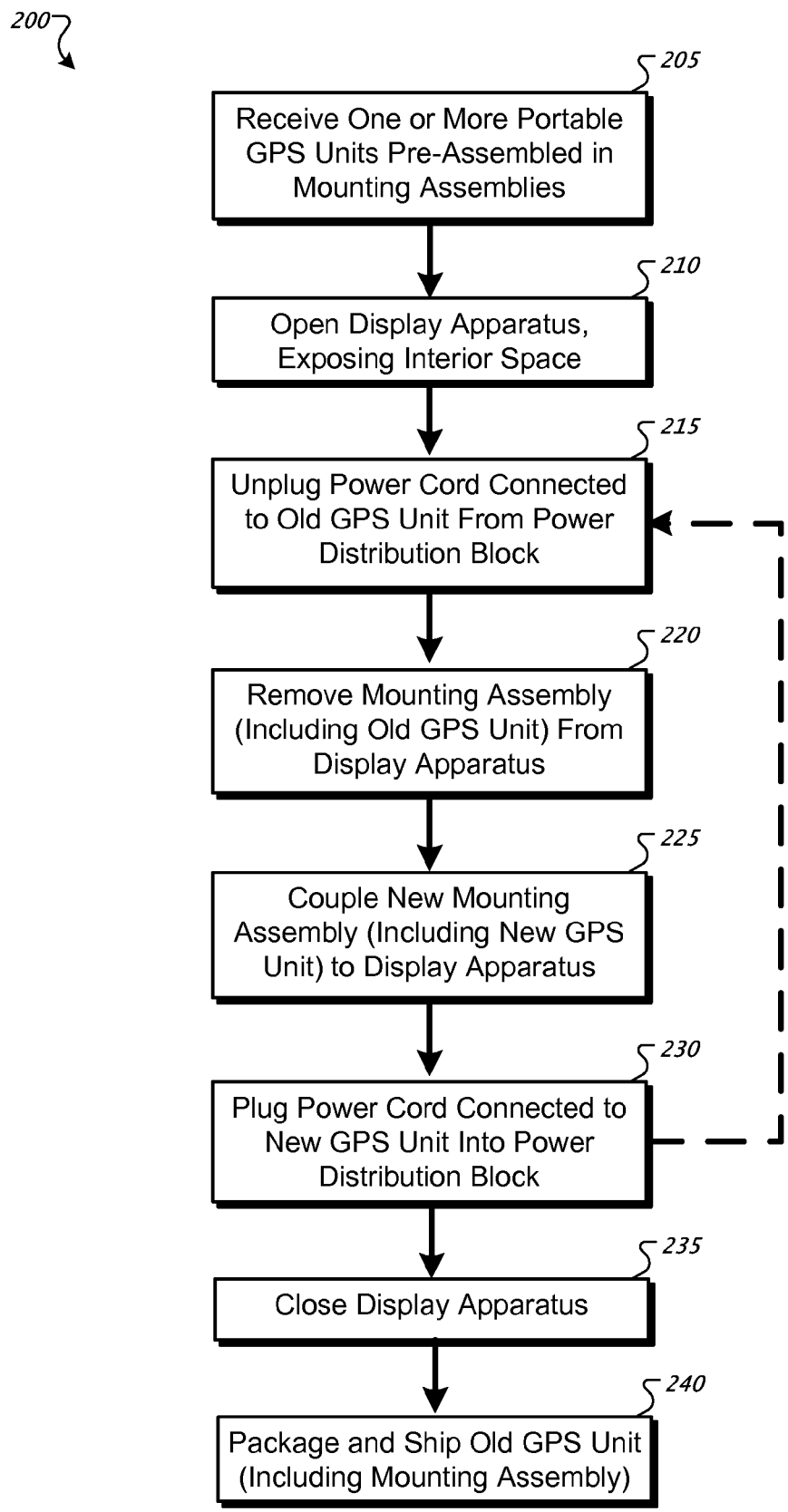
FIG. 7 is flow diagram depicting the new installation of, or replacement of, a portable GPS unit at a display apparatus, in accordance with some embodiments.

Referring now to FIG. 7, a retail store can replace one or more GPS units on display in a display apparatus, for example, with newer models of GPS units. In some examples, the retail store can receive new GPS units already assembled in mounting assemblies from, for example, a distribution hub, third-party vendor, or the like. Since the GPS units come pre-assembled in the mounting assemblies, installation in the display apparatus located in the store can be performed promptly and without the use of tools. Additionally, since the GPS units can arrive in the store already assembled in mounting assemblies, the security of the individual GPS units is maintained, even when not installed in a display apparatus. For example, a portable GPS unit is a small item that could easily be removed from a store in a pant pocket, backpack, jacket pocket, or the like. When assembled in a mounting assembly, the overall size of the GPS unit/mounting assembly is greatly increased, thus making removal from the store without detection less likely. In such a way, the susceptibility of the GPS unit to theft is decreased when attached to a mounting assembly. Furthermore, in embodiments where special tools are required to remove the GPS from the mounting assembly, the difficulty of separating a GPS unit from a mounting assembly is increased. For example, when a GPS unit arrives pre-assembled at a store in a mounting assembly, it is unnecessary for the store to maintain special tools to assemble individual GPS units in mounting assemblies. Without access to the specialty tools, the difficulty of separating the GPS unit from the mounting assemblies is increased, thus the susceptibility of the GPS unit to theft is decreased when attached to a mounting assembly using specialty fasteners.

Referring now to FIG. 7, an illustrative process 200 for replacing a GPS unit 110 in a display apparatus 100 can include a number of operations performed in a retail store environment by one or more store workers. In operation 205, one or more GPS units 110 can be received in the store after having been previously coupled to a mounting assembly 130 (see FIG. 3). The GPS units 110 can be coupled to corresponding mounting assemblies 130 at a remote site, for example, a distribution hub, third-party vendor, or the like. In operation 210, a store worker can open a display apparatus 100, thus exposing the interior space 121 within the base 120 of the display apparatus. This can be accomplished, for example, by using keys to unlock the locking mechanism 122 of the base 120. Once the base 120 is opened, the store worker can remove old GPS units 110 from the display and install new GPS units 110. In operation 215, the power plug 114 coupled to an old GPS unit 110 that is to be removed can be unplugged from the power distribution block 160. In operation 220, the mounting assembly 130 (along with the GPS unit 110 and power cord 112 coupled thereto) can be removed from the base 120. For example, this can be accomplished toollessly by pushing on the locking pin 137 until it is substantially flush with the exterior surface of the mounting post 135. When the locking pin 137 is depressed in such a manner, the locking pin 137 no longer engages the mounting sleeve 125 by penetrating the orifice 127, thus freeing the mounting post 135 to slide and rotate relative to the mounting sleeve 125. Once free, the mounting assembly 130 can be removed from the base 120 by sliding the mounting post 135 out of the sleeve 125.

In operation 225, a new mounting assembly 130' (along with a new GPS unit 110' and power cord 112' coupled thereto) can be installed onto the display apparatus 100. For example, this can be accomplished toollessly by first inserting the power cord 112 attached to the new GPS unit 110 into an empty mounting sleeve 125, depressing the locking pin 137, and inserting the mounting post 135 into the mounting sleeve 125 until it contacts the stop 128. The mounting post 135 can then be rotated within the mounting sleeve 125 (while maintaining contact with the stop 128) until the locking pin 137 engages the sleeve 125 by penetrating the orifice 127, thus securing the mounting assembly 130 and coupled GPS unit 110 to the base 120. In operation 230, the power plug 114 of the power cord 112 can be inserted into an empty power port 162 of the power distribution block 160. Operations 215-230 can optionally be repeated to replace additional GPS units 110 in the display apparatus 100. In operation 235, the base 120 of the display apparatus 100 can be closed and locked, thus limiting access to components (such as the securing mechanisms and power adapter) contained within the internal space 121 at least partially defined by the base 120. In operation 240, any previously removed GPS unit 110 and its associated mounting assembly 130 can be packaged and shipped to a remote location, for example, to a distribution hub.

A number of embodiments of the invention have been described. Nevertheless, it will be understood that various modifications may be made without departing from the spirit and scope of the invention. Accordingly, other embodiments are within the scope of the following claims.

What is claimed is:

1. A display apparatus for portable GPS units, comprising:
    a base having a lockable panel that conceals an interior space at least partially defined by the base;
    a plurality of mounting sleeves coupled to the base;
    a plurality of mounting posts lockingly engaged with the mounting sleeves in the interior space at least partially defined by the base;
    a plurality of mounting brackets secured to the plurality of mounting posts, each of the mounting brackets fixedly retaining a respective portable GPS unit of a plurality of portable GPS units so that the respective portable GPS unit is rigidly secured relative to the base; and
    a power supply unit concealed in the base and having a plurality of power ports shaped to receive automotive accessory power plugs from the plurality of portable GPS units fixedly retained in the mounting brackets;
    wherein:
        the base defines a top surface,
        each mounting sleeve of the plurality of mounting sleeves is hollow, defines an internal cavity, and extends below the top surface of the base into the interior space,
        each of the plurality of mounting posts is slidably engaged within the cavity of and toollessly removable from a corresponding one of the mounting sleeves coupled to the base, and
        each of the plurality of mounting posts extends upwardly from the corresponding one of the plurality of mounting sleeves through and upwardly beyond the top surface of the base.

2. The apparatus of claim 1, wherein each of the plurality of mounting posts comprises a releasable locking structure to engage a mating structure of the corresponding one of the mounting sleeves inside the interior space so that each releasable locking structure is accessible only when the locking panel of the base is adjusted to an opened position.

3. The apparatus of claim 1, Wherein each of the mounting brackets is pivotable about a generally horizontal axis relative to a corresponding one of the mounting posts.

4. The apparatus of claim 3, wherein each of the mounting brackets engages four sides, a front surface, and a rear surface of the respective portable GPS unit retained by the mounting bracket.

5. The apparatus of claim 4, wherein each of the mounting brackets rigidly secures the respective portable GPS unit retained by the mounting bracket while exposing substantially all of the user interface components of the respective portable GPS unit.

6. The apparatus of claim 4, wherein each of the mounting brackets exposes a power port on one of the four sides of the respective portable GPS unit retained by the mounting bracket so that the power port can connect with a power cord of one of the automotive accessory power plugs.

7. A display apparatus, comprising:
    a security enclosure that at least partially encloses a secure space accessible by a lockable door;
    a plurality of portable electronic devices rigidly mounted to the security enclosure in an operative position elevated above the security enclosure so that a user interface for each of the portable electronic devices is viewable;
    a plurality of mounting assemblies to retain the portable electronic devices in the operative position substantially preventing movement of each of the portable electronic devices from the operative position above the security enclosure, each mounting assembly being lockingly secured with a corresponding one of the portable electronic devices and being toollessly removable from the security enclosure; and
    a power source having a plurality of automotive accessory power ports concealed in the secure space of the security enclosure to receive power cords extending from each of the portable electronic devices arranged in the operative position elevated above the security enclosure;
    wherein each mounting assembly comprises an elongated shaft that is slidably engaged within and toollessly removable from a corresponding mounting channel extending into the secure space, and the power cords extend from the power source to each of the portable electronic devices through a corresponding one of the plurality of mounting assemblies and the corresponding mounting channel.

8. The apparatus of claim 7, wherein each mounting assembly comprises a releasable locking structure to engage the corresponding mounting channel, the releasable locking structure being accessible only through the secure space of the security enclosure.

9. The apparatus of claim 7, wherein each of the portable electronic devices is pivotable about a generally horizontal axis relative to the security enclosure.

10. The apparatus of claim 9, wherein each mounting assembly comprises a bracket that rigidly secures the portable electronic device retained by the mounting assembly while exposing substantially all of the user interface components of the portable electronic device.

11. The apparatus of claim 10, wherein each of the mounting brackets engages four sides of the portable electronic device While exposing a power port on one of the four sides of the portable electronic device.

12. The apparatus of claim 7, wherein each portable electronic device is selected from the group consisting of: GPS units, digital cameras, cellular phones, and PDAs.

13. A display apparatus for portable GPS units, comprising:
    a base having a lockable panel that conceals an interior space at least partially defined by the base;
    a plurality of mounting sleeves coupled to the base;
    a plurality of mounting posts lockingly engaged with the mounting sleeves in the interior space at least partially defined by the base;
    a plurality of mounting brackets secured to the plurality of mounting posts, each of the mounting brackets fixedly retaining a respective portable GPS unit of a plurality of portable GPS units so that the respective portable GPS unit is rigidly secured relative to the base;
    a power supply unit concealed in the base and having a plurality of power ports shaped to receive automotive accessory power plugs from the plurality of portable GPS units fixedly retained in the mounting brackets; and
    a locking structure concealed in the interior space, wherein the locking structure is releasably engaged with each of the plurality of mounting posts.

14. The display apparatus of claim 13, wherein the base defines an access panel configured to provide user access to the interior space allowing a user to releasably couple the locking structure to the plurality of mounting posts and to couple the automotive accessory power plugs from the plurality of portable OPS units to respective ones of the plurality of power ports by way of the access panel.

15. The display apparatus of claim 1, wherein:
    each of the plurality of mounting brackets includes:
        at least one backing plate, a first corner arm extending from the at least one backing plate,
a second corner arm extending from the at least one backing plate, and
an edge arm extending from the at least one backing plate,
each of the plurality of portable GPS units includes a first edge, a second edge opposite the first edge, a first corner adjacent the first edge, and a second corner adjacent the first edge opposite the first corner,
the first corner arm of each of the plurality of mounting brackets receives the first corner of the respective portable GPS unit,
the second corner arm of each of the plurality of mounting brackets receives the second corner of the respective portable GPS unit, and
the edge arm of each of the plurality of mounting brackets solely receives a linear portion of the second edge of the respective portable GPS unit.

16. The display apparatus of claim 15, wherein each of the first corner arm, the second corner arm, and the edge arm defines two opposing ends, and both of the two opposing ends of each of the first corner arm, the second corner arm, and the edge arm are coupled to the at least one backing plate.

17. The display apparatus of claim 16, wherein:
the at least one backing plate includes a first backing plate and a second backing plate selectively coupled to the first backing plate,
the first corner arm and the second corner arm are each coupled o the first backing plate,
the edge arm is coupled to the second backing plate,
the first corner arm and the second corner arm are spaced from and free from contact with the second backing plate, and
the edge arm is spaced from and free from contact with the first backing plate.

18. A display apparatus for portable GPS units, comprising:
a base having a lockable panel that conceals an interior space at least partially defined by the base;
a plurality of mounting sleeves coupled to the base;
a plurality of mounting posts lockingly engaged with the mounting sleeves in the interior space at least partially defined by the base;
a plurality of mounting brackets secured to the plurality of mounting posts, each of the mounting brackets fixedly retaining a respective portable GPS unit of a plurality of portable GPS units so that the respective portable GPS unit is rigidly secured relative to the base; and
a power supply unit concealed in the base and having a plurality of power ports shaped to receive automotive accessory power plugs from the plurality of portable GPS units fixedly retained in the mounting brackets;
wherein:
each of the plurality of mounting brackets includes:
a first substantially planar backing plate,
first coupling tabs rearwardly extending from the first substantially planar backing plate,
a second substantially planar backing plate, and
second coupling tabs rearwardly extending from the second substantially planar backing plate, and
the first substantially planar backing plate is coupled to the second substantially planar backing plate via coupling of the first coupling tabs to the second coupling tabs.

19. The display apparatus of claim 18, wherein:
each of the plurality of mounting brackets includes:
a first corner arm extending from only one of the first substantially planar backing plate and the second substantially planar backing plate,
a second corner arm extending from only the one of the first substantially planar backing plate and the second substantially planar backing plate, and
an edge arm extending from only the other of the first substantially planar backing plate and the second substantially planar backing plate,
each of the plurality of portable GPS units includes a first edge, a second edge opposite the first edge, a first corner adjacent the first edge, and a second corner adjacent the first edge opposite the first corner,
the first corner arm receives the first corner of the respective portable GPS unit,
the second corner arm receives the second corner of the respective portable GPS unit, and
the edge arm solely receives a linear portion of the second edge of the respective portable GPS unit.

20. The display apparatus of claim 19, wherein one of the first substantially planar backing plate and the second substantially planar backing plate is rotatably mounted to a top of a corresponding one of the plurality of mounting plates to selectively rotate about a substantially horizontal axis relative to the corresponding one of the plurality of mounting plates, and selective rotation of the respective GPS unit is the only substantial movement of the respective GPS unit allowed relative to the corresponding one of plurality of mounting posts.

* * * * *